United States Patent
Kumar K. et al.

(10) Patent No.: US 9,106,388 B2
(45) Date of Patent: Aug. 11, 2015

(54) PARALLEL CRC COMPUTATION WITH DATA ENABLES

(71) Applicant: Vitesse Semiconductor Corporation, Camarillo, CA (US)

(72) Inventors: Venkat Praveen Kumar K., Hyderabad (IN); Nihit Chattar, Hyderabad (IN); Dishant Singh Rajput, Hyderabad (IN)

(73) Assignee: Microsemi Communications, Inc., Aliso Viejo, CA (US)

( * ) Notice: Subject to any disclaimer, the term of this patent is extended or adjusted under 35 U.S.C. 154(b) by 0 days.

(21) Appl. No.: 14/135,437

(22) Filed: Dec. 19, 2013

(65) Prior Publication Data

US 2014/0359404 A1 Dec. 4, 2014

Related U.S. Application Data

(63) Continuation of application No. 12/981,160, filed on Dec. 29, 2010, now abandoned.

(51) Int. Cl.
*G06F 11/00* (2006.01)
*H04L 1/00* (2006.01)
*H03M 13/09* (2006.01)
*G06F 11/10* (2006.01)

(52) U.S. Cl.
CPC .......... *H04L 1/0061* (2013.01); *G06F 11/1004* (2013.01); *H03M 13/091* (2013.01)

(58) Field of Classification Search
CPC .......... H03M 13/091; H03M 13/2957; H03M 13/635
USPC .......................... 714/758, 776, 781
See application file for complete search history.

(56) References Cited

U.S. PATENT DOCUMENTS

| | | | |
|---|---|---|---|
| 5,619,516 A * | 4/1997 | Li et al. | 714/807 |
| 6,519,737 B1 * | 2/2003 | Derby | 714/781 |
| 7,168,024 B2 * | 1/2007 | Farnsworth | 714/758 |
| 7,627,802 B2 * | 12/2009 | Pisek et al. | 714/758 |
| 2004/0100962 A1 | 5/2004 | Kim et al. | |
| 2005/0086571 A1 * | 4/2005 | Farnsworth | 714/758 |
| 2006/0195762 A1 * | 8/2006 | Back | 714/758 |
| 2006/0274789 A1 | 12/2006 | Pong | |
| 2009/0158120 A1 * | 6/2009 | Palanki et al. | 714/758 |
| 2009/0210770 A1 | 8/2009 | DeCusatis et al. | |
| 2009/0282148 A1 | 11/2009 | Wong et al. | |

* cited by examiner

*Primary Examiner* — Bryce Bonzo
*Assistant Examiner* — Elmira Mehrmanesh
(74) *Attorney, Agent, or Firm* — Klein, O'Neill & Singh, LLP (57) ABSTRACT

Methods and devices generate cyclic redundancy check (CRC) values for a sequence of parallel words of data. The data words may have only some of the bits enabled. The input words are preconditioned, and then a common block generates a CRC remainder value. A specific preconditioning is selected based on the number of enabled bits. Additional post-processing may be performed to the CRC remainder.

1 Claim, 5 Drawing Sheets

PARALLEL CRC COMPUTATION WITH DATA ENABLES

CROSS-REFERENCE TO RELATED APPLICATION

The present application is a continuation of U.S. patent application Ser. No. 12/981,160, filed Dec. 29, 2010, which is incorporated by reference herein.

BACKGROUND OF THE INVENTION

This invention relates generally to communications networks and, more specifically, to cyclic redundancy checks for communications networks.

Communications networks often transfer data between devices located at different locations in the network. Many communication networks transfer the data in packets. Unfortunately, errors may occur during the communication. Additional information may be added to the packets to allow the communicating devices to detect communication errors. A cyclic redundancy check (CRC) is a common method for adding information to the communication packets to detect errors.

Communication networks that operate at high data rates may perform operations related to the communication on many bits of data in parallel so that the operations may be performed at a slower clock rate while maintaining the high data rate. Although CRC algorithms are commonly defined for serial operation on a sequence of bits of data, parallel CRC calculations are used to perform the operations at slower clock rates.

As data rates increase in communication networks, the number of bits of data operated on in parallel may also increase. The increased number of parallel data bits may increase complexity of parallel operations. Additionally, the packets communicated often vary in size, that is, the packets may contain varying amounts of data. The sizes of the packets are quantized in minimum units of data, commonly bytes. Further complexity in calculating CRC values may be added when the number of bits of data operated on in parallel is greater than the size of the units of data in the packets.

SUMMARY OF THE INVENTION

Aspects of the present invention provide calculation of cyclic redundancy checks on parallel data having varying sizes.

In some aspects the invention provides a device for generating a cyclic redundancy check (CRC) on parallel input data having data enables, the parallel input data having N bits, the cyclic redundancy check using a CRC polynomial having p bits, the device including: a plurality of conditioning blocks coupled to at least a portion of an input word and an intermediate CRC value, each conditioning block configured to generate bitwise exclusive OR values of values from the input word and values from the intermediate CRC value; a selector coupled to the conditioning blocks and configured to select the bitwise exclusive OR values from one of the conditioning blocks; and a CRC modulo block coupled to the selector and configured to generate a remainder for the selected bitwise exclusive OR values divided by the CRC polynomial.

In some aspects the invention provides a device for generating a cyclic redundancy check (CRC) on parallel input data having data enables, the parallel input data having N bits, the cyclic redundancy check using a CRC polynomial having p bits, the device including: a plurality of preconditioning blocks coupled to at least a portion of an input word and at least a portion of an intermediate CRC value, each preconditioning block configured to generate bitwise exclusive OR values of values from the input word and values from the intermediate CRC value; a first selector coupled to the preconditioning blocks and configured to select the bitwise exclusive OR values from one of the preconditioning blocks; a CRC modulo block coupled to the first selector and configured to generate a CRC value for the selected bitwise exclusive OR values; a second selector coupled to a portion of the intermediate CRC value and selecting zero values and values from the portion of the intermediate CRC value; and an exclusive OR block coupled to the CRC modulo block and the second selector and configured to generate bitwise exclusive OR values of the CRC value from the CRC modulo block and the selected values from the second selector.

In some aspects the invention provides a method for use in generating a cyclic redundancy check (CRC) on parallel input data in a communication system having data enables, the parallel input data having N bits, the cyclic redundancy check using a CRC polynomial having p bits, the method including: receiving an input word of the input data having n enabled bits; when n is less than N, aligning an intermediate CRC value with the enabled bits of the input word and generating bitwise exclusive OR values of the aligned intermediate CRC value and the enabled bits of the input word; when n equals N, generating bitwise exclusive OR values of the intermediate CRC value and the bits of the input word; padding the exclusive OR values with zeros; generating a remainder of the zero padded exclusive OR values divided by the CRC polynomial; and supplying the remainder as an updated intermediate CRC value.

In some aspects the invention provides a method of generating a cyclic redundancy check (CRC) value for a data block, the data block supplied as parallel input data having N bits and having data enables, the cyclic redundancy check using a CRC polynomial having p bits, the method including: receiving a first input word including the first N bits from the data block; generating first bitwise exclusive OR values of an initial value and the bits of the first input word; padding the first exclusive OR values with zeros; generating an intermediate CRC value by finding the remainder of the zero padded first exclusive OR values divided by the CRC polynomial; receiving additional input words having N subsequent bits from the data block and for each additional input word: generating bitwise exclusive OR values of the intermediate CRC value and the bits of the additional input word; padding the exclusive OR values with zeros; generating an updated intermediate CRC value for use with a next input word by finding the remainder of the zero padded exclusive OR values divided by the CRC polynomial; and receiving a final input word having n enabled bits from the data block, n less than or equal to N; when n is less than N, aligning the intermediate CRC value with the enabled bits of the final input word and generating final bitwise exclusive OR values of the aligned intermediate CRC value and the enabled bits of the final input word; when n equals N, generating final bitwise exclusive OR values of the intermediate CRC value and the bits of the final input word; padding the final exclusive OR values with zeros; and generating the CRC value by finding the remainder of the zero padded final exclusive OR values divided by the CRC polynomial.

In some aspects the invention provides a method for generating a cyclic redundancy check (CRC) on parallel input data in a communication system having data enables, the parallel input data having N bits, the cyclic redundancy check using a CRC polynomial having p bits, the method including:

receiving an input word of the input data having n enabled bits; when n is less than p, selecting a first portion of an intermediate CRC value and generating bitwise exclusive OR values of the first portion of the intermediate CRC value and the enabled bits of the input word; when n is not less than p, generating bitwise exclusive OR values of the intermediate CRC value and the enabled bits of the input word; when p equal N, selecting the exclusive OR values as a CRC operand and, when p not equal N, padding the exclusive OR values with zeros to produce the CRC operand; generating a CRC value for the CRC operand; when n is less than p, selecting a second portion of the intermediate CRC value, generating bitwise exclusive OR values of the second portion of the intermediate CRC value and the generated CRC value, and supplying the exclusive OR values as an updated intermediate CRC value; and when n is not less than p, supplying the generated CRC value as the updated intermediate CRC value.

In some aspects the invention provides a method for use in generating a cyclic redundancy check (CRC) on parallel input data in a communication system having data enables, the parallel input data having N bits, the cyclic redundancy check using a CRC polynomial having p bits, p less than N, the method including: receiving an input word of the input data having n enabled bits; when n is less than p, generating bitwise exclusive OR values of the n most-significant bits of the intermediate CRC value and the enabled bits of the input word and appending p-n zeros to the most-significant bit position to produce a CRC operand; when n equals p, generating bitwise exclusive OR values of the intermediate CRC value and the enabled bits of the input word and appending N-n zeros to the most-significant bit position to produce a CRC operand; when n is greater than p, generating bitwise exclusive OR values of the enabled bits of the input word and the intermediate CRC value with n-p zeros appended to the least-significant bit position and, when n is less than N, appending N-n zeros to the most-significant bit position to produce a CRC operand; generating a CRC value for the CRC operand by appending p zeros to the CRC operand to produce a dividend and finding the remainder of the dividend divided by the CRC polynomial; when n is less than p, selecting p-n least-significant bits of the intermediate CRC value, appending n zeros to the least-significant bit position of the selected bits of the intermediate CRC value, generating bitwise exclusive OR values of selected bits of the intermediate CRC value with appended zeros and the generated CRC value, and supplying the exclusive OR values as an updated intermediate CRC value; and when n is not less than p, supplying the generated CRC value as the updated intermediate CRC value.

In some aspects the invention provides a method for use in generating a cyclic redundancy check (CRC) on parallel input data in a communication system having data enables, the parallel input data having N bits, the cyclic redundancy check using a CRC polynomial having p bits, p equal N, the method including: receiving an input word of the input data having n enabled bits; when n is less than p, generating bitwise exclusive OR values of the n most-significant bits of the intermediate CRC value and the enabled bits of the input word and appending p-n zeros to the most-significant bit position to produce a CRC operand; when n equals p, generating bitwise exclusive OR values of the intermediate CRC value and the bits of the input word to produce a CRC operand; generating a CRC value for the CRC operand by appending p zeros to the CRC operand to produce a dividend and finding the remainder of the dividend divided by the CRC polynomial; when n is less than p, selecting p-n least-significant bits of the intermediate CRC value, appending n zeros to the least-significant bit position of the selected bits of the intermediate CRC value, generating bitwise exclusive OR values of selected bits of the intermediate CRC value with appended zeros and the generated CRC value, and supplying the exclusive OR values as an updated intermediate CRC value; and when n equals p, supplying the generated CRC value as the updated intermediate CRC value.

In some aspects the invention provides a method for use in generating a cyclic redundancy check (CRC) on parallel input data in a communication system having data enables, the parallel input data having N bits, the cyclic redundancy check using a CRC polynomial having p bits, p greater than N, the method including: receiving an input word of the input data having n enabled bits; generating bitwise exclusive OR values of the n most-significant bits of the intermediate CRC value and the enabled bits of the input word and, when n is less than N, appending N-n zeros to the most-significant bit position of the exclusive OR values to produce a CRC operand; generating a CRC value for the CRC operand by appending p zeros to the CRC operand to produce a dividend and finding the remainder of the dividend divided by the CRC polynomial; selecting p-n least-significant bits of the intermediate CRC value and appending n zeros to the least-significant bit position of the selected bits of the intermediate CRC value; generating bitwise exclusive OR values of selected bits of the intermediate CRC value with appended zeros and the generated CRC value; and supplying the exclusive OR values as an updated intermediate CRC value.

These and other aspects of the invention are more fully comprehended on review of this disclosure.

BRIEF DESCRIPTION OF THE DRAWINGS

These and other features, aspects, and advantages of the present invention will be more fully understood when considered with regard to the following detailed description, appended claims, and accompanying drawings wherein:

DETAILED DESCRIPTION OF THE INVENTION

Figure 1:
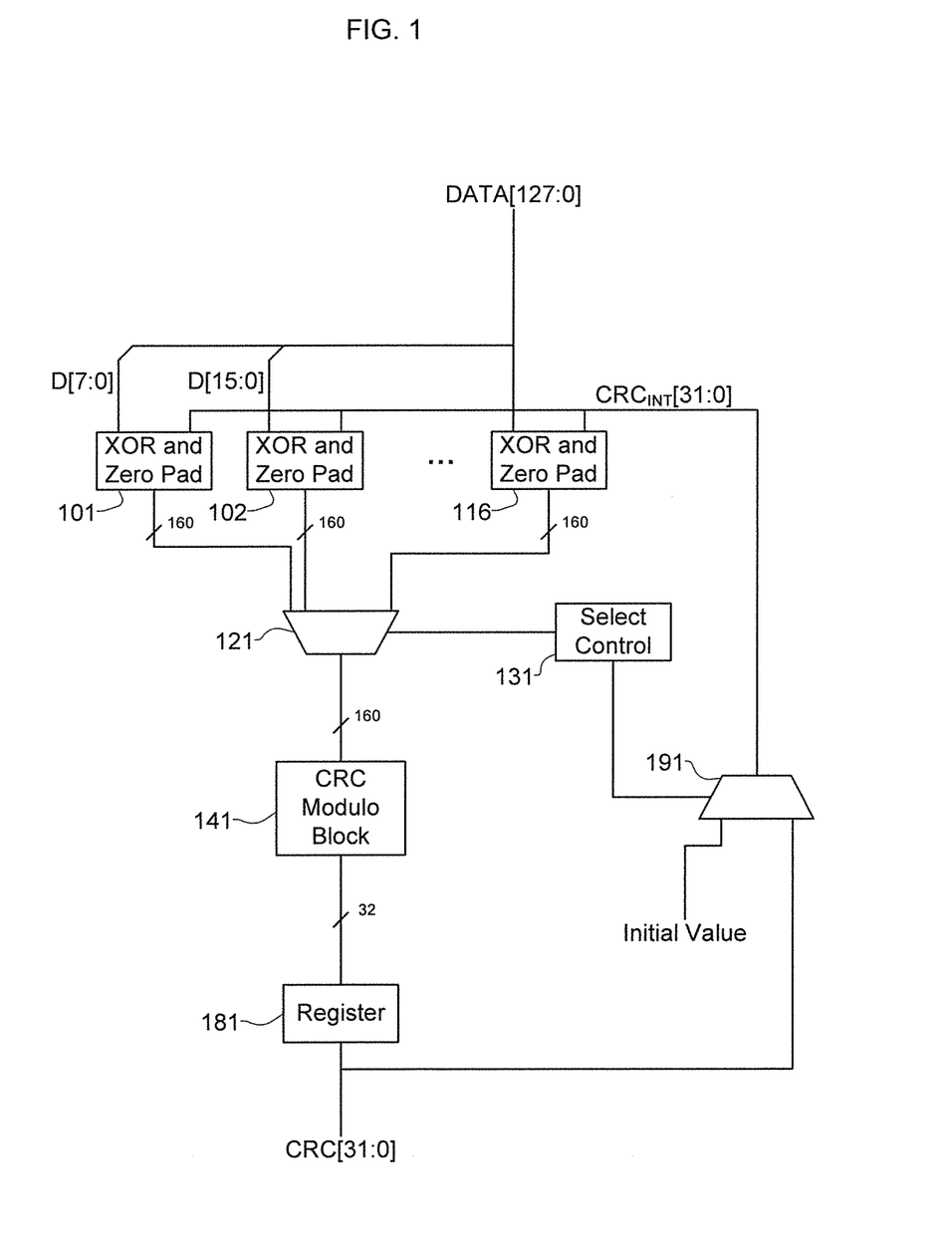
FIG. 1 is a block diagram of a device for parallel calculation of CRC values in accordance with aspects of the present invention.

FIG. 1 is a block diagram of a device for parallel calculation of CRC values in accordance with aspects of the present invention. The device may be part of an integrated circuit, for example, an Ethernet transceiver. In many embodiments, the device may be comprised of electronic circuitry, although in some embodiments the device may include both hardwired circuitry and programmable elements, for example, as determined by registers, or by a processor configured by program instructions. The device receives data blocks and generates corresponding CRC values for the information in the data blocks. A data block may, for example, be from a communication packet and the generated CRC value may be used to add a checksum value to the packet or to check a checksum value present in the packet. For communication packets formatted according to various protocols, the data blocks received by the device may exclude certain sections of the packets, for example, framing signals.

The input data is received as a sequence of input words. For the first input word from a data block, the device generates an intermediate CRC value that is the CRC value for that input word. For each subsequent input word from the data block, the device uses the input word and the prior intermediate CRC value to generate a new intermediate CRC value that is the CRC value for the data received from the data block so far. For the final input word, the generated intermediate CRC value is the CRC value for the data block. Each input word, other than the final input word, contains the same number of bits of data from the data block. The final input word may contain fewer bits of data from the data block. When the total number of bits from the data block used to generate the CRC value is not an integral multiple of the number of bits in the input words, some of the bits in the final input word will not be used to generate the CRC value. The bits in the input word having information from the data block used to generate the CRC value may be considered valid bits or enabled bits.

In the embodiment of FIG. 1, the input words DATA[127-0] have 128 bits, or 16 bytes, of information, and 1 to 16 bytes may have information from the data block. Conditioning blocks 101-116 compute a bitwise exclusive OR (XOR) of values from the input words and an intermediate CRC value $CRC_{INT}[31-0]$ and also add zero padding. For each potential number of enabled bytes in the input word, one of the conditioning blocks receives a corresponding string bits from the input words.

The first conditioning block 101 receives the least-significant byte of the input word DATA[7:0] and receives the intermediate CRC value $CRC_{INT}[31-0]$. The least-significant byte of the input word is bitwise exclusive ORed with the most-significant byte of the intermediate CRC value, and the other bytes of the intermediate CRC value are appended in their corresponding positions. Zero padding is added to the exclusive OR result to generate a 20-byte value. Fifteen bytes of zeros are appended to the most-significant bit position and one byte of zeros is appended to the least-significant bit position.

The second conditioning block 102 receives the least-significant two bytes of the input word DATA[15:0] and receives the intermediate CRC value $CRC_{INT}[31-0]$. The least-significant bytes of the input word are bitwise exclusive ORed with the most-significant two bytes of the intermediate CRC value, and the other bytes of the intermediate CRC value are appended in their corresponding positions. Zero padding is added to the exclusive OR result to generate a 20-byte value. Fourteen bytes of zeros are appended to the most-significant bit position and two bytes of zeros is appended to the least-significant bit position.

The third through fifteenth conditioning blocks 103-115 function in a like manner with each receiving an increasing number of bytes from the input word.

The final conditioning block 116 receives all sixteen bytes of the input word DATA[127:0] and receives the intermediate CRC value $CRC_{INT}[31-0]$. The most-significant four bytes of the input word are bitwise exclusive ORed with the intermediate CRC value, and the other bytes of the input word are appended in their corresponding positions. Zero padding is added to the exclusive OR result to generate a 20-byte value. Four bytes of zeros are appended to the least-significant bit position.

The outputs of the conditioning blocks are received by a first selector 121. The first selector 121 selects the output of one of the conditioning blocks and supplies the selected output to a CRC modulo block 141. The output that is selected is indicated by a selection control signal from a control block 131. The control block 131 generates the selection control signal so that the output selected is from the conditioning block that corresponds to the number of enabled bytes in the input word. For example, when the input word has all sixteen bytes enabled, the output from the final conditioning block 116 is selected, and when the input word has two bytes enabled, the output from the second conditioning block 102 is selected. The control block 131 may determine which output is selected, for example, by using a signal accompanying the input word that indicates which bytes of the input word are enabled, or by comparing a cumulative count of the amount data received for the data block with a known size of the data block.

The CRC modulo block 141 receives the selected value from the first selector 121. The remainder of the received value divided by the CRC polynomial is generated by the CRC modulo block 141. The embodiment of FIG. 1 uses a 32-bit CRC polynomial, and the remainder also has 32 bits. The CRC modulo block, in many embodiments, includes exclusive OR logic gates to generate the remainder in parallel. The exclusive OR logic gates are interconnected according to the particular polynomial used.

The remainder from the CRC modulo block 141 is saved in a register 181. The registered value may be supplied to the conditioning blocks 101-116 as the intermediate CRC value $CRC_{INT}[31-0]$ for use in processing a next input word. The registered value may also be supplied, after the final input word from the data block, as the generated CRC value CRC [31-0]. The register may be timed by a clock signal that is also synchronized with the input words.

A second selector 191 receives the registered value and an initial value. The initial value may be all zeros, all ones, or some other value depending on a particular CRC variation. The output of the second selector 191 is the intermediate CRC value $CRC_{INT}[31-0]$ supplied to the conditioning blocks 101-116. For the first input word from a data block, the second selector 191 selects the initial value. For subsequent input words, the second selector 191 selects the registered value. The selection is indicated by a control signal from the control block 131. The control block 131 may determine which value is selected, for example, by using a signal accompanying the input word that indicates the beginning of a data block.

The embodiment of the device illustrated in FIG. 1 is for a 128-bit input word, byte sized enables, a 32-bit CRC polynomial, and for CRC calculations that operate first on the least-significant bit of data (labeled bit 0). Other embodiments of the device may have input words of a different width, have differently sized enables, and perform differently defined CRC calculations.

Figure 2:
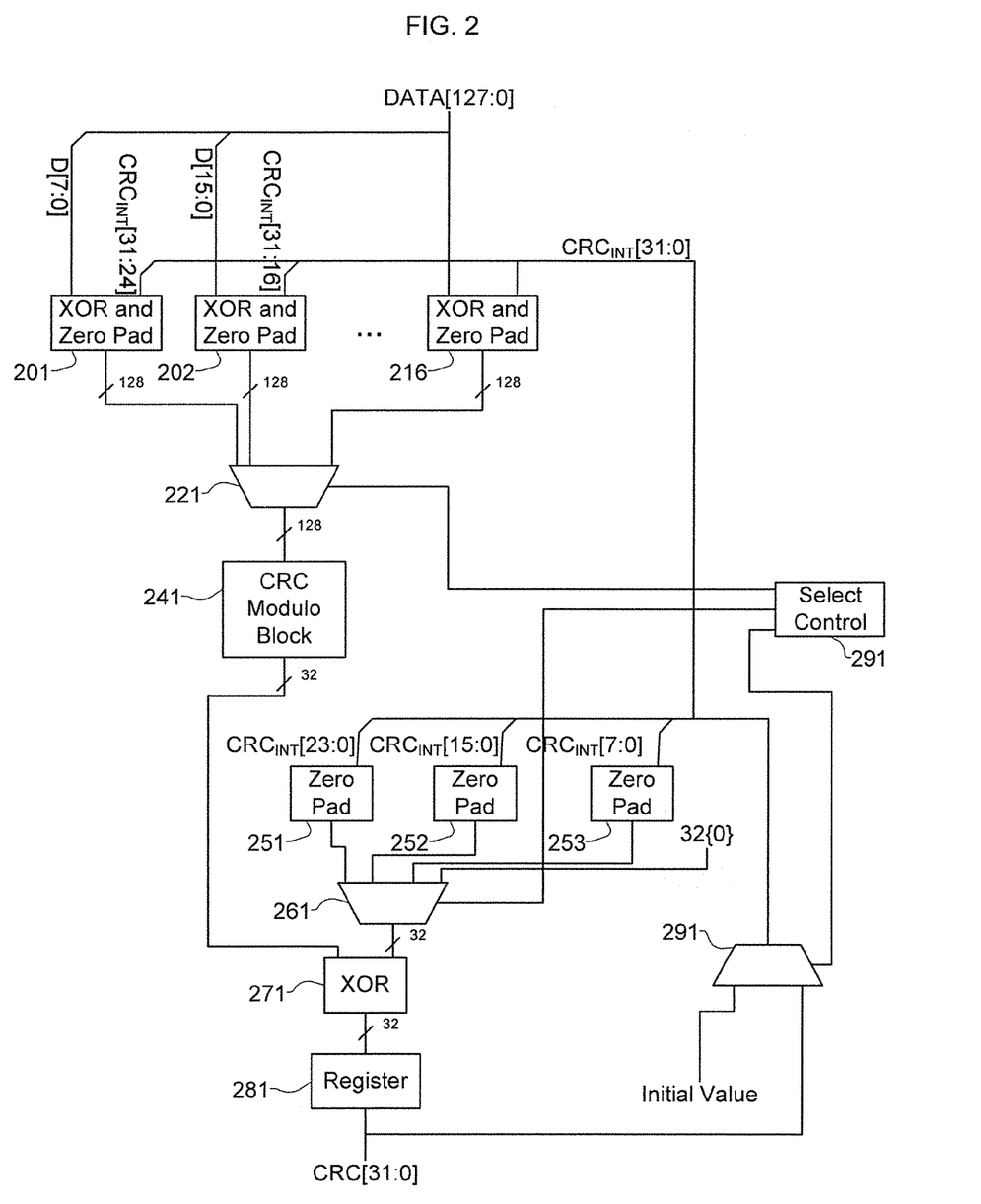
FIG. 2 is a block diagram of another device for parallel calculation of CRC values in accordance with aspects of the present invention.

FIG. 2 is a block diagram of another device for parallel calculation of CRC values in accordance with aspects of the present invention. The device may be part of an integrated circuit, for example, an Ethernet transceiver. In many embodiments, the device may be comprised of electronic circuitry, although in some embodiments the device may include both hardwired circuitry and programmable elements, for example, as determined by registers or by a processor configured by program instructions. The device receives input data from a data block and generates a CRC value by generating an intermediate CRC value for each of a sequence of input words. Each input word, other than the final input word, contains the same number of bits from the data block. The final input word may contain fewer bits from the data block. For the final input word, the generated intermediate CRC value is the CRC value for the data block.

In the embodiment of FIG. 2, the input words DATA[127-0] have 128 bits, or 16 bytes, of information, and 1 to 16 bytes may have information from the data block. The bytes having information from the data block may be considered valid bytes or enabled bytes. Preconditioning blocks 201-216 compute a bitwise exclusive OR of values from the input words and values from an intermediate CRC value $CRC_{INT}[31-0]$ and may also add zero padding.

The first preconditioning block 201 receives the least-significant byte of the input word DATA[7:0] and receives the most-significant byte of the intermediate CRC value $CRC_{INT}[31-24]$. The received bytes are bitwise exclusive ORed. Zero padding is added to the exclusive OR result to generate a 16-byte value. Fifteen bytes of zeros are appended to the most-significant bit position.

The second preconditioning block 202 receives the least-significant two bytes of the input word DATA[15:0] and receives the most-significant two bytes of the intermediate CRC value $CRC_{INT}[31-16]$. The received bytes of the input word are bitwise exclusive ORed with the received bytes of the intermediate CRC value. Zero padding is added to the exclusive OR result to generate a 16-byte value. Fourteen bytes of zeros are appended to the most-significant bit position.

The third through fifteenth preconditioning blocks 203-215 function is a like manner with each receiving an increasing number of bytes from the input word.

The final preconditioning block 216 receives all sixteen bytes of the input word DATA[127:0] and receives all four bytes of the intermediate CRC value $CRC_{INT}[31-0]$. The most-significant four bytes of the input word are bitwise exclusive ORed with the intermediate CRC value and the other bytes of the input word are appended in their corresponding positions.

A first selector 221 receives the outputs of the preconditioning blocks 201-216 and selects one of the outputs to supply to a CRC modulo block 241. The output that the first selector 221 selects is indicated by a first selection control signal from a control block 231. The control block generates the first selection control signal so that the output selected is from the preconditioning block that corresponds to the number of enabled bytes in the input word. For example, when the input word has all sixteen bytes enabled, the output from the final preconditioning block 216 is selected, and when the input word has two bytes enabled, the output from the second preconditioning block 202 is selected. The control block 231 may determine which value is selected, for example, by using a signal accompanying the input word that indicates which bytes of the input word are enabled, or by comparing a cumulative count of the amount data received for the data block with a known size of the data block.

The CRC modulo block 241 receives the selected value from the first selector 221. The CRC modulo block 241 generates a corresponding CRC value. The CRC value may be generated by appending a string of zeros matching the order of the CRC polynomial to the received value and finding the remainder of the zero-padded value divided by the CRC polynomial. The CRC modulo block, in many embodiments, includes exclusive OR logic gates to generate the remainder. The exclusive OR logic gates are interconnected according to the particular polynomial used.

Zero padding blocks 251-253 append zeros to portions of the intermediate CRC value $CRC_{INT}[31-0]$. The first zero padding block 251 receives the three least-significant bytes of the intermediate CRC value $CRC_{INT}[23-0]$ and appends one byte of zeros to the least-significant bit position. The second zero padding block 252 receives the two least-significant bytes of the intermediate CRC value $CRC_{INT}[15-0]$ and appends two bytes of zeros to the least-significant bit position. The third zero padding block 253 receives the least-significant byte of the intermediate CRC value $CRC_{INT}[7-0]$ and appends three bytes of zeros to the least-significant bit position.

A second selector 261 receives the zero padded values from the zero padding blocks 251-253 and a 32-bit zero value. The value the second selector 261 selects is indicated by a second selection control signal from the control block 231. The control block generates the second selection control signal so that the value selected includes any bits of the intermediate CRC value $CRC_{INT}[31-0]$ not included in the CRC value from the CRC modulo block 241 by way of the first selector 221 and the preconditioning blocks 201-216. For example, when the input word has all sixteen bytes enabled, the 32-bit zero value is selected since the first selector 221 selected the output from the final preconditioning block 216 (which used all 32 bits of the intermediate CRC value $CRC_{INT}[31-0]$ to produce its output). For another example, when the input word has two bytes enabled, the value from the second zero padding block 252 (which includes the two least-significant bytes of the intermediate CRC value $CRC_{INT}[15-0]$) is selected since the first selector 221 selected the output from the second preconditioning block 202 (which used the most-significant two bytes of the intermediate CRC value $CRC_{INT}[31-16]$ to produce its output).

An exclusive OR block 271 generates a bitwise exclusive OR of the value from the second selector and the CRC value from the CRC modulo block 241. The exclusive OR value is saved in a register 281. The registered value may be supplied to the preconditioning clocks 201-216 and the zero padding blocks 251-253 as the intermediate CRC value $CRC_{INT}[31-0]$ for use in processing a next input word. The registered value may also be supplied, after the final input word from the data block, as the generated CRC value CRC [31-0]. The register may be timed by a clock signal that is also synchronized with the input words.

A third selector 291 receives the registered value and an initial value. The initial value may be all zeros, all ones, or some other value depending on a particular CRC variation. The output of the third selector 291 is the intermediate CRC value $CRC_{INT}[31-0]$ supplied to the preconditioning blocks 101-116 and the zero padding blocks 251-253. For the first input word from a data block, the third selector 291 selects the initial value. For subsequent input words, the selector 291 selects the registered value. The selection is indicated by a third selection control signal from the control block 231. The control block 231 may determine which value is selected, for example, by using a signal accompanying the input word that indicates the beginning of a data block.

The embodiment of the device illustrated in FIG. 2 is for a 128-bit input word, byte sized enables, a 32-bit CRC polynomial, and for CRC calculations that operate first on the least-significant bit of data (labeled bit 0). Other embodiments of the device may have input words of a different width, have differently sized enables, or perform differently defined CRC calculations.

The CRC calculation device of FIGS. 1 and 2 may be further understood in light of the following explanation of the operations performed. The explanation may aid particularly in understanding embodiments having different sizes of input words, valid bit enables, and CRC polynomials.

Let P(x) represents the CRC polynomial and p the degree of the polynomial. For example, for the 32-bit CRC polynomial defined for Ethernet and many other protocols, $P(x)=x^{32}+x^{26}+x^{23}+x^{22}+x^{16}+x^{12}+x^{11}+x^{10}+x^8+x^7+x^5+x^2+$ x+1 and p=32. Computation of a CRC value for a message involves multiplying the message by $x^p$, dividing the product by the CRC polynomial P(x), and the remainder of the division is the CRC value. The operations are performed in Galois fields.

Let M(x) represent the cumulative message received in prior input words, N(x) represent the message received in a current input word, and D(x) represent the cumulative message received including the current input words. D(x) can be written in terms of M(x) and $$N(x) \text{ as } D(x)=x^n \cdot M(x)+N(x), \tag{i}$$

where n is the number of bits in the input word N(x).

Let Z(x) and Y(x) be the CRC values for M(x) and D(x) respectively. Then M(x) can be expressed as $$x^p \cdot M(x)=P(x) \cdot R(x)+Z(x), \tag{ii}$$

where R(x) is the quotient of $(x^p \cdot M(x))/P(x)$. Similarly D(x) can be expressed as $$x^p \cdot D(x)=P(x) \cdot T(x)+Y(x), \tag{iii}$$

where T(x) is the quotient of $(x^p \cdot D(x))/P(x)$.

After multiplying both sides by $x^p$, equation (i) can be written as $x^p \cdot D(x)=x^n \cdot (x^p \cdot M(x))+x^p \cdot N(x)$. Substituting for $x^p \cdot M(x)$ from equation (ii) results in $$x^p \cdot D(x)=x^n \cdot (P(x) \cdot R(x)+Z(x))+x^p \cdot N(x) \tag{iv}$$

Let W(x) by defined by $$W(x)=x^p \cdot N(x)+x^n \cdot Z(x) \tag{v}$$

and let U(x) be the remainder of W(x)/P(x). Then $$W(x)=P(x) \cdot S(x)+U(x), \tag{vi}$$

where S(x) is the quotient of W(x)/P(x). By combining equations (iv) and (v), $x^p \cdot D(x)=P(x) \cdot (x^n \cdot R(x))+W(x)$. Combining this with equation (vi) gives $x^p \cdot D(x)=P(x) \cdot (x^n \cdot R(x)+S(x))+U(x)$. Combining this with equation (iii) gives $P(X) \cdot T(x)+Y(x)=P(x) \cdot (x^n \cdot R(x)+S(x))+U(x)$. And by equating similar terms, $T(x)=x^n \cdot R(x)+S(x)$ and Y(x)=U(x). Therefore, U(x) is the final CRC value for D(x), which is the remainder of W(x)/P(x).

Calculations for a device as illustrated in FIG. 1 can be derived as follows. Consider $W(x)=x^n \cdot Z(x)+x^p \cdot N(x)$, which can be rewritten for different values of p and n as:

$$\text{for } p>n, \; W(x)=x^n(Z(x)+x^{p-n}N(x)), \tag{I}$$

$$\text{for } p=n, \; W(x)=x^n(Z(x)+N(x)), \tag{II}$$

$$\text{and for } p<n, \; W(x)=x^p(x^{n-p}Z(x)+N(x)), \tag{III}$$

Since the multiplications and additions are in Galois fields, multiplying by $x^n$ is equivalent to appending n zeros to the least-significant position. The above equations indicate that the cumulative CRC is a function of a previous CRC and the new input word. Thus a common block that computes CRC values for parallel data can be reused by manipulating the input data to the same block when only some input bits are valid.

The above equations and observations are combined to arrive at operations to provide p-bit CRC values for a sequence of N-bit input words having n valid bits. Let F mod(y) be a function which computes the remainder for y divided by P(x). The input to function has N+p bits and the remainder has p bits.

The operations are expressed in a Verilog-style notation where { } represents concatenation, ^ represents bitwise exclusive OR, N{0} represents replication of N zeros, and d[n:1] represents bit selection of bits n through 1 of a bit vector d.

For full input words, where n=N, using equation (III) for N>p, $$CRC=F \text{ mod}(\{(\text{data}\char`\^\{CRC_{prior},(N-p)\{0\}\}),p\{0\}\});$$

using equation (I) for N<p, $$CRC=F \text{ mod}(\{(\{\text{data},(p-N)\{0\}\}\char`\^CRC_{prior}),N\{0\}\});$$

and using equation (II) for N=p, $$CRC=F \text{ mod}(\{(\text{data}\char`\^CRC_{prior}),p\{0\}\});$$

For a partial final input word, where n<N, using equation (III) for n>p, $$CRC=F \text{ mod}(\{(N-n)\{0\},(\text{data}[n-1:0]\char`\^\{CRC_{prior},(n-p)\{0\}\}),p\{0\}\});$$

using equation (I) for n<p, $$CRC=F \text{ mod}(\{(N-n)\{0\},(\{\text{data}[n-1:0],(p-n)\{0\}\}\char`\^CRC_{prior}),n\{0\}\});$$

and using equation (II) for N=p, $$CRC=F \text{ mod}(\{(N-n)\{0\},(\text{data}[n-1:0]\char`\^CRC_{prior}),p\{0\}\});$$

Calculations for a device as illustrated in FIG. 2 can be derived as follows. Again consider $W(x)=x^n \cdot Z(x)+x^p \cdot N(x)$, and let $Z'(x)=x^n \cdot Z(x)$ which can be rewritten as $Z'(x)=x^p \cdot Z'_1(x)+Z'_2(x)$, where $$\text{for } p<n: Z'_1(x)=x^{n-p} \cdot Z(x) \text{ and } Z'_2(x)=p \text{ zeros,} \tag{IV}$$

$$\begin{aligned}&\text{and for } p>n: Z'_1(x)=n \text{ most-significant bits of } Z(x) \text{ and}\\&Z'_2(x)=p-n \text{ least-significant bits of } Z(x) \text{ padded}\\&\text{with } n \text{ zeros}\end{aligned} \tag{V}$$

W(x) can be rewritten using the definition of Z'(x) as $$W(x)=x^p(Z'_1(x)+N(x))+Z'_2(x) \tag{VI}$$

From equation (VI) it can be observed that the final CRC value is the exclusive OR of $Z'_2(x)$ with the CRC value for $Z'_1(x)+N(x)$.

Equations (IV) through (VI) and the preceding observation are combined to arrive at further operations to provide p-bit CRC values for a sequence of N-bit input words having n valid bits. Let Fcrc(y) be a function that computes CRC values for parallel inputs y having N bits.

For full input words, where n=N, using equations (IV) and (VI) for N>p, $$CRC=Fcrc(\text{data}\char`\^\{CRC_{prior},(N-p)\{0\}\});$$

using equations (V) and (VI) for N<p, $$CRC=Fcrc(\text{data}\char`\^CRC_{prior}[p-1:p-N])\char`\^\{CRC_{prior}[p-N-1:0],N\{0\}\};$$

For a partial final input word, where n<N, using equations (IV) and (VI) for n>p, $$CRC=Fcrc(\{(N-n)\{0\},(\text{data}\char`\^\{CRC_{prior},(n-p)\{0\}\})\});$$

and using equations (V) and (VI) for n<p, $$CRC=Fcrc(\{(N-n)\{0\},(\text{data}\char`\^CRC_{prior}[p-1:p-n])\})\char`\^\{CRC_{prior}[p-n-1:0],n\{0\}\};$$

Figure 3:
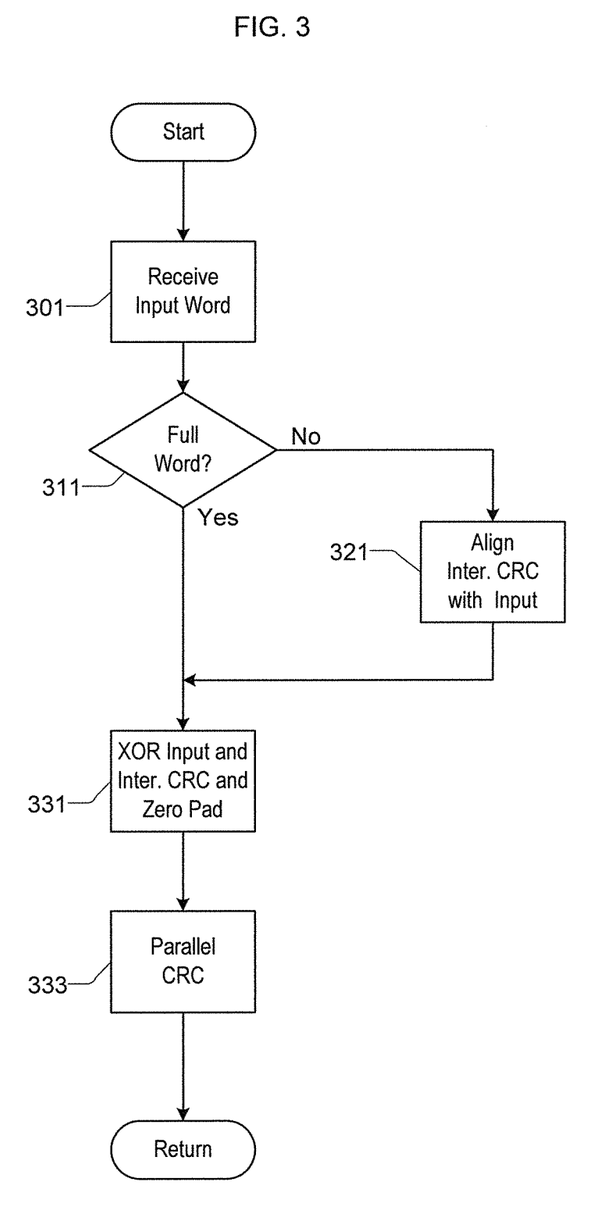
FIG. 3 is a flowchart of a process for parallel calculation of CRC values in accordance with aspects of the present invention.

FIG. 3 is a flowchart of a process for parallel calculation of CRC values in accordance with aspects of the present invention. In one embodiment, the process is implemented using specialized hardware, for example, a device as illustrated in FIG. 1. Other embodiments of the process use a processor programmed by instructions, alone or in combination with other hardware. The process generally receives words of data from a block to be processed and performs CRC calculations on the data. For each word of data received, the process uses a prior intermediate CRC value to produce an updated intermediate CRC value that is representative of the CRC calculation of the data received so far. For the first word of data, the intermediate CRC value used may be all zeros or another value depending on a particular variation of the CRC being calculated. After operating on the entire data block, the process creates a CRC value. The CRC value may, for example, be transmitted in a packet that contains the data block.

In block 301, the process receives an input word containing data from the data block. The input word may have, for example, 32 or 128 bits.

In block 311, the process determines whether the input word is a full word, that is, whether all the bits in the input word are data bits from the data block to be processed. When the amount of data from the data block for the CRC calculation is not an integer multiple of the width of the input word, a final input word will include bits that are not included in the CRC computation. In various embodiments, the extra bits may contain zero padding, values from a packet containing the data block that are not included in the CRC calculation, or values from another data block. The process may determine whether the input word is a full word by using a signal received in block 301 with the input word that indicates which bits of the input word are to be processed, by comparing a cumulative count of the amount data received for the data block with a known size of the data block, or by other techniques. When the input word is a full word, the process continues to block 331; otherwise, the process continues to block 321.

In block 321, the process aligns the prior intermediate CRC value with the valid bits of the input word. More specifically, the most-significant bit of the prior intermediate CRC value is aligned with most-significant bit that is valid in the input word. For example, in an embodiment of the process with input words having N=128 bits and an intermediate CRC value having p=32 bits (matching a CRC polynomial of size p=32), when 48 bits of an input word are valid, the process aligns the most-significant bit (commonly labeled bit 31) of the prior intermediate CRC value with the 48th bit (commonly labeled bit 47) of the input word. The process may also zero pad the input word. In some embodiments, the process fills the data that is not valid with zeros. In other embodiments, the invalid bits in the input words may arrive at the process with zero values.

In block 331, the process computes a bitwise exclusive OR of the input word and the prior intermediate CRC value. When the input word is a full word, the bitwise exclusive OR is computed with the most-significant bit of the input word aligned with the most-significant bit of the prior intermediate CRC value. When the input word is not a full word the bitwise exclusive OR is computed with the alignment from block 321. When the input word and the prior intermediate CRC value have different numbers of bits, the one having fewer bits is zero padded to match the bit width of one having more bits. The zero padding adds bits to the least-significant bits of the input word or the prior intermediate CRC value. For example, in an embodiment of the process with input words having N=128 bits and a CRC polynomial of size p=32, 96 zero-valued bits are added at the least-significant bit position of the intermediate CRC value. In another example with input words having N=32 bits and a CRC polynomial of size p=40, 8 zero-valued bits are added at the least-significant bit position of the input words. Since the result of an exclusive OR operation of a bit with zero is the value of the bit, some computations of bitwise exclusive OR operations may be reduced to passing a value. Some embodiments of the process may compute bitwise exclusive OR operations for each alignment that may occur and select the appropriate one based on the number of valid bits in the input word. The process additionally zero pads the results of the exclusive OR operation to produce a value having a bit width matching the combined widths of the input word and the size of the CRC polynomial. The additional zeros are appended to the least-significant bit position.

In block 333, the process computes the remainder of the value from block 331 divided by the polynomial for the CRC being calculated. Embodiments of the process may compute the remainder using exclusive OR logic gates interconnected according to the particular CRC polynomial and the width of the input word. The computed remainder may be used, for example, as the CRC intermediate value in another application of the process to input words from the same data block, to create a CRC value for transmission with the data block, or to check a CRC value received with the data block. The process, in block 333, receives an input value having a number of bits matching the combined widths of the input word and the CRC polynomial and produces an output value have a number of bits matching the order of the CRC polynomial. The process thereafter returns.

Figure 4:
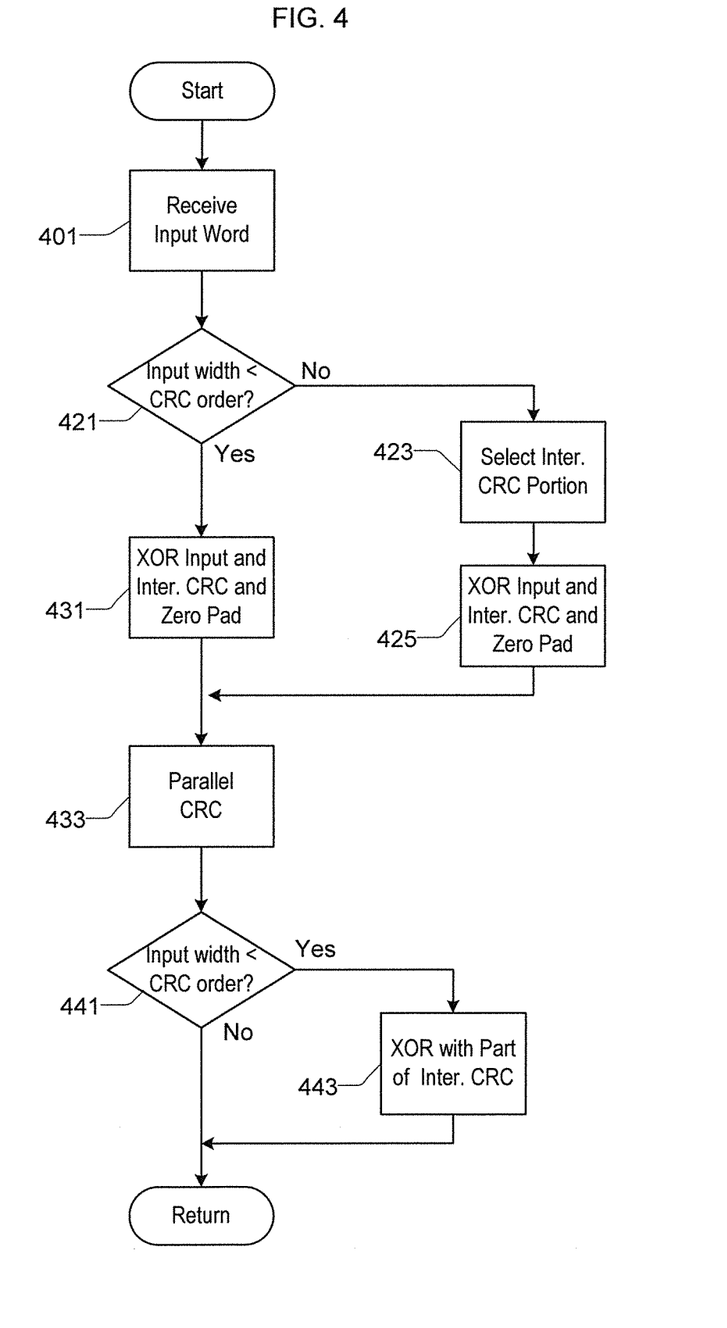
FIG. 4 is a flowchart of another process for parallel calculation of CRC values in accordance with aspects of the present invention.

FIG. 4 is a flowchart of another process for parallel calculation of CRCs in accordance with aspects of the present invention. In one embodiment, the process is implemented using specialized hardware, for example, a device as illustrated in FIG. 2. Other embodiments of the process use a processor programmed by instructions, alone or in combination with other hardware. The process generally receives words of data from a block to be processed and performs CRC calculations on the data using a particular CRC polynomial. For each word of data received, the process uses a prior intermediate CRC value to produce an updated intermediate CRC value that is representative of the CRC calculation of the data received so far. For the first word of data, the intermediate CRC value used may be all zeros or another value depending on a particular variation of the CRC being calculated. After operating on all the data of the data block, the process creates a CRC value for the data block.

In block 401, the process receives an input word containing data from the data block. The input word may have, for example, 128 bits.

In block 421, the process determines whether the number of valid bits in the input word is less than the order of the CRC polynomial. The process may determine the number of valid bits in the input word by using a signal received with the input word in block 401 that indicates which bits of the input word are to be processed. For example, when the input word is received on a parallel bus, an enable signal may be associated with each byte of the parallel bus to signal whether the byte is valid. When the number of valid bits in the input word is less than the order of the CRC polynomial, the process continues to block 423; otherwise, the process continues to block 431.

In block 423, the process selects a portion of the prior intermediate CRC value. The most-significant bits are selected and the number of bits selected matches the number of valid bits in the input word. For example, in an embodiment of the process with input words having N=128 bits and an intermediate CRC value having p=32 bits (matching a CRC polynomial of size p=32), when 24 bits of the input word are valid, the process selects the most-significant 24 bits (commonly labeled bits 31-8) of the prior intermediate CRC value. The process uses the unselected bits of the prior intermediate CRC value in a subsequent block. In block 425, the process computes a bitwise exclusive OR of the valid bits in the input word and the selected portion of the prior intermediate CRC value. The process may also zero pad the value from the bitwise exclusive OR. When the number of valid bits in the input word is less than the width of the input word, the process appends zeros to the most-significant bit position to generate a value having a width matching the width of the input word. For the prior example, the process appends 104 zeros. The process continues to block 433.

In block 431, the process computes a bitwise exclusive OR of the valid bits of the input word and the prior intermediate CRC value. The bitwise exclusive OR is computed with the most-significant valid bit of the input word aligned with the most-significant bit of the prior intermediate CRC value. The process may add zero padding depending on the size of the operands of the bitwise exclusive OR. When the intermediate CRC value has fewer bits than the number of valid bits in the input word, zeros are appended to the least-significant bit position of the intermediate CRC value. And when the number of valid bits in the input word is less than the size of the input word, the process appends zeros to the most-significant bit position so that the number of bits matches the size of the input word.

In block 433, the process computes the CRC value of the value generated in block 431 or block 425. The CRC value may be computed by appending zeros according to the site of the CRC polynomial to the input value to form a dividend and finding the remainder of the dividend divided by the CRC polynomial. Embodiments of the process may compute the CRC value using exclusive OR logic gates interconnected according to the particular CRC polynomial and the width of the input word. The process, in block 433, receives an input value having a number of bits matching the width of the input word and produces an output value have a number of bits matching the order of the CRC polynomial.

In block 441, the process determines whether the number of valid bits in the input word is less than the order of the CRC polynomial. The determination may be done in the same or similar manner as the determination of block 421. When the number of valid bits in the input word is less than the order of the CRC polynomial, the process continues to block 443. Otherwise, the process returns and the CRC value computed in block 433 may be used as the CRC intermediate value in another application of the process to input words from the same data block or as the CRC for the data block.

Figure 5:
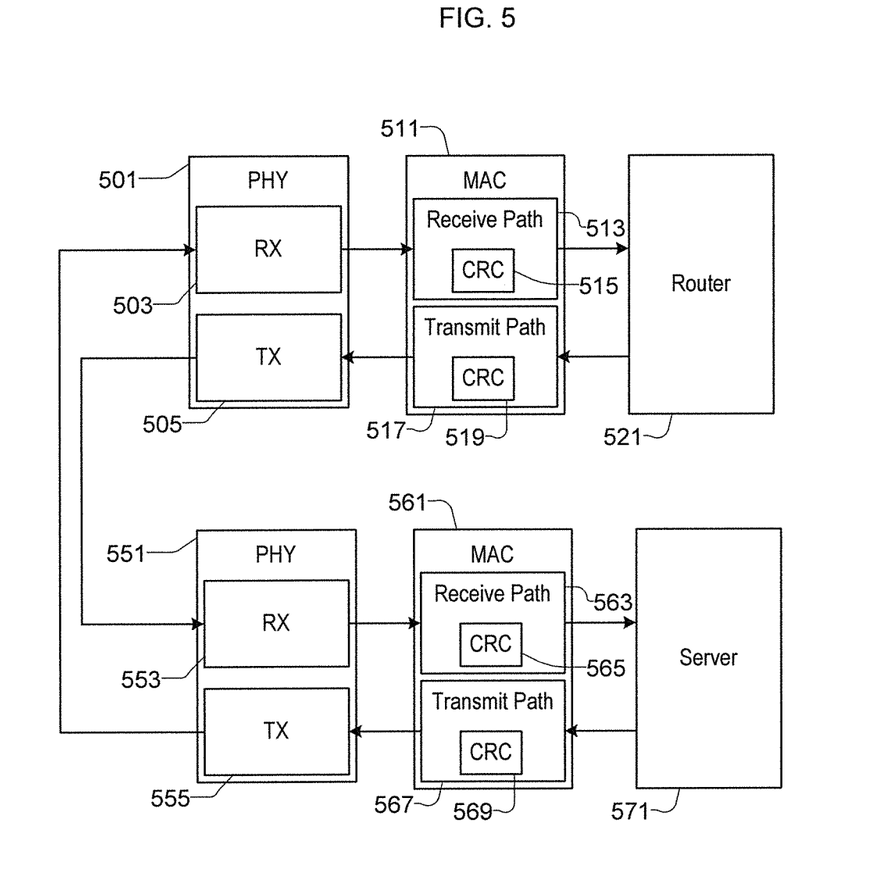
FIG. 5 is a block diagram of a communication system in accordance with aspects of the present invention.

In block 443, the process computes a bitwise exclusive OR of the CRC value from block 433 and a portion of the prior intermediate CRC value. The portion of the prior intermediate CRC value used is the unselected portion from block 423. The process zero pads the least-significant bits of the portion of the prior intermediate CRC value to match the width of the CRC value from block 433 before performing the bitwise exclusive OR. The value from the bitwise exclusive OR may be used as the CRC intermediate value in another application of the process to input words from the same data block or as the CRC value for the data block. The process thereafter returns FIG. 5 is a block diagram of a communication system in accordance with aspects of the present invention. The illustrated system includes a server 571 that communicates with a router 521 using a communications medium. The server is coupled to the communication medium by way of a first media access control device (MAC) 561 that is coupled to a first physical layer device (PHY) 551. The first MAC and PHY may be implemented using one or more integrated circuits on a network interface card. The server sends information to a first transmit path 567 in the first MAC 561 where the information is formatted for transmission. The formatting includes using a first transmit CRC block 569 to add a CRC checksum to the information. The first transmit CRC block 569 may include one of the devices as described above with reference to FIGS. 1 and 2 or other devices that provide processing as described above with reference to FIGS. 3 and 4. In another embodiment, the first transmit CRC block 569 is included in the first PHY 551. The formatted information is supplied to a first transmitter 555 in the first PHY 551 where it is converted to a signal for transmission over the communication medium.

The server 571 receives information by way of first receiver 553 in the first PHY 551 which converts signals from the communication medium to a data sequence that is supplied to a first receive path 563 in the first MAC 561 where the data sequence is formatted for use by the server 571. The formatting includes using a first receive CRC block 565 to check a CRC checksum included in the data sequence. In another embodiment, the first receive CRC block 565 is included in the first PHY 551. The first receive CRC block 565 in the first receive path 563 may be the same as or similar to the first transmit CRC block 569 in the first transmit path 567.

The router 521 is also coupled to the communication medium by way of a second media access control device 511 that is coupled to a second physical layer device 501. The second MAC and PHY of the router may be implemented using integrated circuits on a line card. The router 521 will generally include many additional MAC and PHY devices for communication, for example, with other routers and servers.

The router 521 sends information to the server 571 by sending the information to a second transmit path 517 in the second MAC 511 where the information is formatted for transmission. The formatting includes using a second transmit CRC block 519 to add a CRC checksum to the information. The formatted information is supplied to a second transmitter 505 in the second PHY 501 where is converted to a signal for transmission over the communication medium. The router 521 receives information from the server 571 by way of second receiver 503 in the second PHY 501 which converts signals from the communication medium to a data sequence that is supplied to a second receive path 513 in the second MAC 511 where the data sequence is formatted for use by the server. The formatting includes using a second receive CRC block 513 to check a CRC checksum included in the data sequence. The second receive CRC block 515 in the second receive path 513 and the second transmit CRC block 519 in the second transmit path 517 may include one of the devices as described above with reference to FIGS. 1 and 2 or other devices that may provide processing as described above with reference to FIGS. 3 and 4. CRC blocks may alternatively or additionally be including in the second PHY 501.

In another embodiment, a communication system may be considered an electronic device, for example, a server, a computer, or an optical disc reader, coupled to a memory medium, for example, an optical or magnetic disk, by way of an interface device. Data written from the electronic device to the memory medium may have a CRC checksum generated by the interface device added to the data. When data is read from the memory medium, the interface may verify the CRC checksum to check for errors. In some embodiments, shared circuitry is used to generate and verify the CRC checksum.

Although the invention has been discussed with respect to various embodiments, it should be recognized that the invention comprises the novel and non-obvious claims supported by this disclosure.

What is claimed is:

1. A communication system, comprising:

a server coupled to a communication medium by way of a media access controller (MAC) and a physical layer device (PHY), the MAC including a transmit path for formatting information for transmission over the communication medium by the physical layer device and a receive path for formatting data sequences, provided by the PHY, for use by the server, the MAC additionally including a cyclic redundancy check (CRC) block for generating a cyclic redundancy check (CRC) on parallel input data having data enables, the parallel input data having N bits, the cyclic redundancy check using a CRC polynomial having p bits, the CRC block comprising:

a plurality of preconditioning blocks coupled to at least a portion of an input word and at least a portion of an intermediate CRC value, each preconditioning block configured to generate bitwise exclusive OR values of values from the input word and values from the intermediate CRC value, and to append n-p zeros to the most-significant bit position of the bitwise exclusive OR values, n being the number of bits of the input word coupled to the preconditioning block, and wherein the preconditioning blocks coupled to only a portion of the input word are further configured to append N-n zeros to the least-significant bit position of the bitwise exclusive OR values;

a first selector coupled to the preconditioning blocks and configured to select the bitwise exclusive OR values from one of the preconditioning blocks;

a CRC modulo block coupled to the first selector and configured to generate a CRC value for the selected bitwise exclusive OR values;

a second selector coupled to a portion of the intermediate CRC value and selecting zero values and values from the portion of the intermediate CRC value;

an exclusive OR block coupled to the CRC modulo block and the second selector and configured to generate bitwise exclusive OR values of the CRC value from the CRC modulo block and the selected values from the second selector;

a register coupled to the exclusive OR block and configured to save the generated generate bitwise exclusive OR values; and a third selector coupled to the registered value and an initial value, the second selector configured to supply the registered value or the initial value as the intermediate CRC value.

* * * * *